(12) United States Patent  
Chen

(10) Patent No.: US 10,672,851 B2  
(45) Date of Patent: Jun. 2, 2020

(54) DISPLAY PANEL AND PHOTOELECTRIC DETECTION METHOD

(71) Applicant: Beijing Xiaomi Mobile Software Co., Ltd., Beijing (CN)

(72) Inventor: Chaoxi Chen, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/227,445

(22) Filed: Dec. 20, 2018

(65) Prior Publication Data

US 2019/0312093 A1    Oct. 10, 2019

(30) Foreign Application Priority Data

Apr. 8, 2018 (CN) .......................... 2018 1 0308223

(51) Int. Cl.
  *G09G 3/30* (2006.01)
  *G09G 3/32* (2016.01)
  (Continued)

(52) U.S. Cl.
  CPC ....... *H01L 27/3269* (2013.01); *G09G 3/3208* (2013.01); *H01L 27/3227* (2013.01);
  (Continued)

(58) Field of Classification Search
  CPC .... G09G 3/006; G09G 3/2003; G09G 3/3208; G09G 3/3413; G09G 3/3406;
  (Continued)

(56) References Cited

U.S. PATENT DOCUMENTS 6,272,207 B1 *  8/2001  Tang ..................... G21K 1/025
                                              378/149
9,622,326 B1 *  4/2017  Devyver ............ H05B 37/0227
(Continued)

FOREIGN PATENT DOCUMENTS

CN    201549183 U    8/2010
JP    2005-010407 A  1/2005
(Continued)

OTHER PUBLICATIONS

Chinese Office Action issued by the State Intellectual Property Office of the People's Republic of China (SIPO) dated Jun. 25, 2019, in counterpart Chinese Patent Application No. 201810308223.2.

(Continued)

*Primary Examiner* — Michael J Eurice
(74) *Attorney, Agent, or Firm* — Finnegan, Henderson, Farabow, Garrett & Dunner, L.L.P.

(57) ABSTRACT

The present disclosure relates to a display panel, a photoelectric detection method, a photoelectric detection device and a computer readable storage medium. The display panel includes a pixel array including a plurality of subpixels, wherein through holes are arranged within gaps among the plurality of subpixels, and a photoelectric detection unit including a photoelectric detection array configured to detect incident light passing through the through holes. The photoelectric detection method includes determining a plurality of target subpixels from the plurality of subpixels; determining a time period when the plurality of target subpixels do not emit light, and during the time period, detecting incident light passing through the through holes by the photoelectric detection array.

20 Claims, 11 Drawing Sheets

(51) Int. Cl.
*H01L 27/32* (2006.01)
*G09G 3/3208* (2016.01)
*H01L 51/52* (2006.01)
*G09G 3/34* (2006.01)
*G09G 3/20* (2006.01)

(52) U.S. Cl.
CPC ....... *H01L 51/5281* (2013.01); *G09G 3/2003* (2013.01); *G09G 3/3406* (2013.01); *G09G 3/3413* (2013.01); *G09G 2300/0465* (2013.01); *G09G 2360/144* (2013.01)

(58) Field of Classification Search
CPC .......... G09G 5/026; G09G 2300/0465; G09G 2300/0452; G09G 2320/0242; G09G 2320/062; G09G 2320/0666; G09G 2360/14; G09G 2360/144; H01L 27/12; H01L 27/124; H01L 27/1218; H01L 27/1288; H01L 27/3227; H01L 27/3269; H01L 31/12; H01L 51/5281
See application file for complete search history.

(56) References Cited

U.S. PATENT DOCUMENTS

| | | | | |
|---|---|---|---|---|
| 10,381,381 | B1* | 8/2019 | Choi | H01L 27/1248 |
| 2004/0263670 | A1* | 12/2004 | Yamasaki | G06F 3/0412 348/340 |
| 2006/0055629 | A1* | 3/2006 | Van Woudenberg | G09G 3/2022 345/30 |
| 2006/0209012 | A1* | 9/2006 | Hagood, IV | G09G 3/3433 345/109 |
| 2007/0030222 | A1* | 2/2007 | Lee | G09G 3/3406 345/87 |
| 2007/0211013 | A1* | 9/2007 | Uehara | G09G 3/3413 345/102 |
| 2008/0158137 | A1* | 7/2008 | Yoshida | G09G 3/3413 345/102 |
| 2008/0158138 | A1* | 7/2008 | Yamazaki | G02F 1/13318 345/102 |
| 2008/0252939 | A1* | 10/2008 | Kato | G02F 1/1362 358/472 |
| 2009/0066876 | A1* | 3/2009 | Woo | G01J 1/1626 349/61 |
| 2009/0103161 | A1* | 4/2009 | Kothari | G02F 1/13306 359/245 |
| 2009/0153451 | A1* | 6/2009 | Takama | G06F 3/0412 345/84 |
| 2009/0237381 | A1* | 9/2009 | Otani | G02F 1/1362 345/207 |
| 2010/0066757 | A1 | 3/2010 | Kondo et al. | |
| 2010/0117943 | A1* | 5/2010 | Pak | G02F 1/133512 345/89 |
| 2010/0194721 | A1* | 8/2010 | Miyata | G02F 1/13452 345/206 |
| 2010/0315377 | A1* | 12/2010 | Chang | G06F 3/0386 345/175 |
| 2011/0304532 | A1* | 12/2011 | Suh | G09G 3/3406 345/156 |
| 2012/0013649 | A1* | 1/2012 | Higashi | G09G 3/3426 345/690 |
| 2012/0313912 | A1* | 12/2012 | Kanbayashi | G02F 1/13318 345/207 |
| 2013/0015770 | A1* | 1/2013 | Aitken | G09G 3/3406 315/154 |
| 2013/0027354 | A1* | 1/2013 | Yabuta | G06F 3/042 345/175 |
| 2013/0069914 | A1* | 3/2013 | Chang | G06F 3/0386 345/175 |
| 2013/0222354 | A1* | 8/2013 | Koivunen | G09G 3/3611 345/207 |
| 2014/0132158 | A1 | 5/2014 | Land et al. | |
| 2014/0160175 | A1* | 6/2014 | Uemura | G09G 3/20 345/690 |
| 2014/0240642 | A1* | 8/2014 | Furukawa | H05B 33/0857 349/65 |
| 2014/0320446 | A1* | 10/2014 | Kim | G06F 3/044 345/174 |
| 2014/0340363 | A1* | 11/2014 | Ikeda | G06F 3/042 345/175 |
| 2016/0092717 | A1* | 3/2016 | Ling | G06K 9/0004 382/125 |
| 2016/0253935 | A1* | 9/2016 | Gerets | G02F 1/13318 345/1.3 |
| 2016/0266695 | A1* | 9/2016 | Bae | G06F 1/1643 |
| 2017/0039931 | A1* | 2/2017 | Kubota | G09G 5/363 |
| 2017/0040404 | A1* | 2/2017 | Kusunoki | H01L 27/3262 |
| 2017/0092187 | A1* | 3/2017 | Bergquist | G09G 3/20 |
| 2017/0285815 | A1* | 10/2017 | Yamazaki | G06F 3/0412 |
| 2018/0089491 | A1* | 3/2018 | Kim | G06F 3/0412 |
| 2018/0151656 | A1* | 5/2018 | Choo | G09G 3/3233 |
| 2019/0034020 | A1* | 1/2019 | He | G02F 1/13338 |
| 2019/0042825 | A1* | 2/2019 | He | G06K 9/0004 |
| 2019/0086659 | A1* | 3/2019 | Ding | H01L 27/156 |
| 2019/0155429 | A1* | 5/2019 | Kim | G06F 3/042 |
| 2019/0303639 | A1* | 10/2019 | He | A61B 5/14532 |

FOREIGN PATENT DOCUMENTS

| | | |
|---|---|---|
| WO | WO 2014/077950 A1 | 5/2014 |
| WO | WO 2018/023722 A1 | 2/2018 |

OTHER PUBLICATIONS

European Search Report dated Jun. 14, 2019, in counterpart EP Application No. 18248067.3.
International Search Report dated Jan. 21, 2019, in counterpart International Application No. PCT/CN2018/106648.
Second Chinese Office Action issued by the State Intellectual Property Office of the People's Republic of China (SIPO) dated Dec. 4, 2019, in counterpart Chinese Patent Application No. 201810308223.2.
Korean Office Action dated Mar. 11, 2020, in counterpart Korean Application No. 10-2019-7010190.

* cited by examiner

300

| determining a plurality of target subpixels from a plurality of subpixels of a pixel array, the plurality of target subpixels being within an orthographic projection of a photoelectric detection array on a plane of the pixel array | ~301 |

| determining a time period when the plurality of target subpixels do not emit light | ~302 |

| during the time period, detecting incident light passing through the through holes by a photoelectric detection array | ~303 |

Fig. 3

DISPLAY PANEL AND PHOTOELECTRIC DETECTION METHOD

CROSS REFERENCE TO RELATED APPLICATION

This application claims priority to Chinese Patent Application No. 201810308223.2, filed on Apr. 8, 2018, the entire content of which is incorporated herein by reference.

TECHNICAL FIELD

The present disclosure generally relates to the field of electronic technologies, and more particularly, to a display panel, a photoelectric detection method, a photoelectric detection device, and a computer readable storage medium.

BACKGROUND

With rapid development of electronic techniques, capacities of terminals, such as phones and tablet computers, are greatly improved. In order to sense in real time ambient light to adjust brightness of a display region on a panel of a terminal, a photodetector is generally arranged in the terminal, to detect the ambient light.

Conventionally, a hole is generally arranged within a partial region other than the display region on the panel of the terminal. The photodetector may be arranged below the hole. The ambient light may pass through the hole and be detected by the photodetector.

SUMMARY

According to a first aspect of embodiments of the present disclosure, there is provided a display panel. The display panel includes: a pixel array including a plurality of subpixels, wherein through holes are arranged within gaps among the plurality of subpixels; and a photoelectric detection unit including a photoelectric detection array, wherein the photoelectric detection array is configured to detect incident light passing through the through holes.

According to a second aspect of embodiments of the present disclosure, there is provided a photoelectric detection method, applied to a terminal including a display panel according to any one of embodiments of the first aspect. The method includes: determining a plurality of target subpixels from the plurality of subpixels, wherein the plurality of target subpixels are subpixels within an orthographic projection of the photoelectric detection array on a plane of the pixel array; determining a time period when the plurality of target subpixels do not emit light; and during the time period, detecting incident light passing through the through holes by the photoelectric detection array.

According to a third aspect of embodiments of the present disclosure, there is provided a terminal, including a display panel according to any one of embodiments of the first aspect. The terminal also includes: a processor coupled to the display panel; and a memory configured to store instructions executable by the processor. The processor is configured to execute a method according to any one of embodiments of the first aspect.

BRIEF DESCRIPTION OF THE DRAWINGS

The accompanying drawings herein are incorporated in and become parts of the specification, illustrate embodiments consistent with the disclosure and, together with the description, serve to explain the principles of the disclosure.

FIG. 3 is a flow chart illustrating a photoelectric detection method according to an exemplary embodiment of the present disclosure.

DETAILED DESCRIPTION

Description will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of devices and methods consistent with aspects related to the disclosure as recited in the appended claims.

Figure 1:
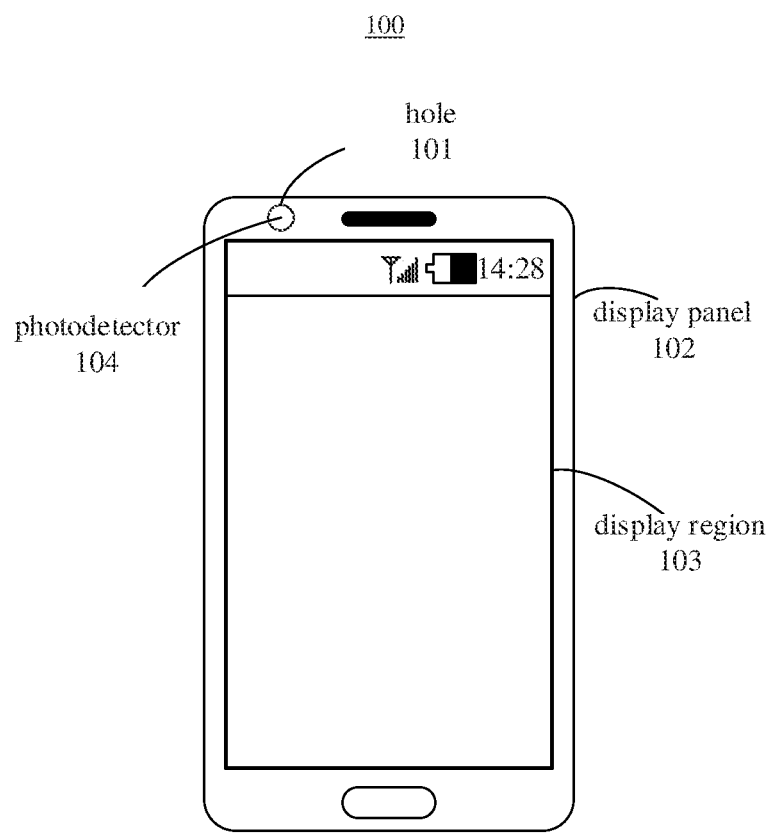
FIG. 1 is a schematic diagram illustrating a terminal according to prior art.

FIG. 1 is a schematic diagram illustrating a terminal 100 according to prior art. As illustrated in FIG. 1, a hole 101 is generally arranged within a partial region other than a display region 102 of a display panel 103. A photodetector 104 may be arranged below the hole 101. The ambient light may pass through the hole 101 and be detected by the photodetector 104. Since the hole 101 may occupy a certain area on the display panel 102, the area of the display region 103 is restricted. As a result, a screen ratio of the terminal 100 is reduced, a trend to a full-screen of the terminal is hindered, and an appearance of the terminal 100 may be affected. Therefore, embodiments of the present disclosure provide a display panel to increase the screen ratio of the terminal, increase display performance of the terminal and improve the appearance of the terminal.

Figure 2A:
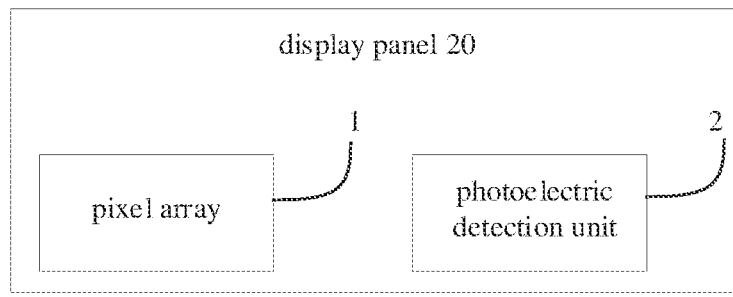
FIG. 2A is a schematic diagram illustrating a display panel according to an exemplary embodiment of the present disclosure.

FIG. 2A is a schematic diagram illustrating a display panel 20 according to an exemplary embodiment of the present disclosure. Referring to FIG. 2A, the display panel 20 includes a pixel array 1 and a photoelectric detection unit 2.

Figure 2B:
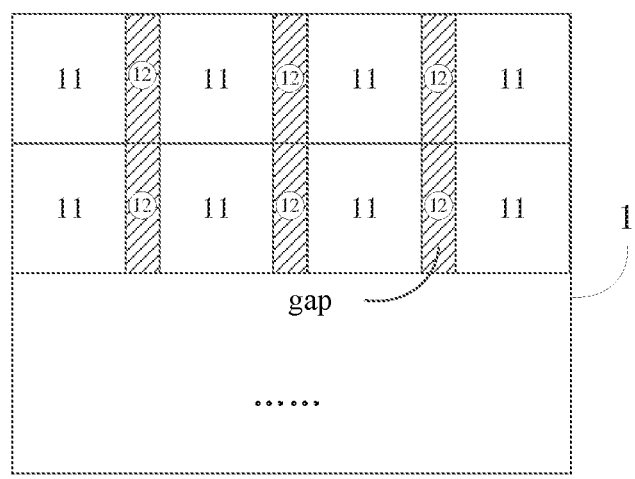
FIG. 2B is a schematic diagram illustrating a pixel array according to an exemplary embodiment of the present disclosure.

Referring to FIG. 2B, the pixel array 1 includes a plurality of subpixels 11. Through holes 12 are arranged within gaps among the plurality of the subpixels 11.

Figure 2C:
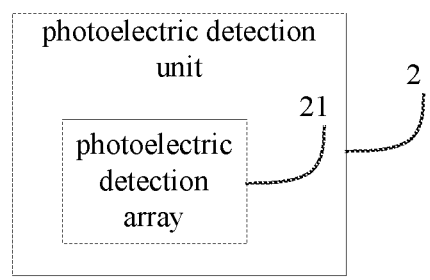
FIG. 2C is a schematic diagram illustrating a photoelectric detection unit according to an exemplary embodiment of the present disclosure.

Referring to FIG. 2C, the photoelectric detection unit 2 includes a photoelectric detection array 21.

Figure 2D:
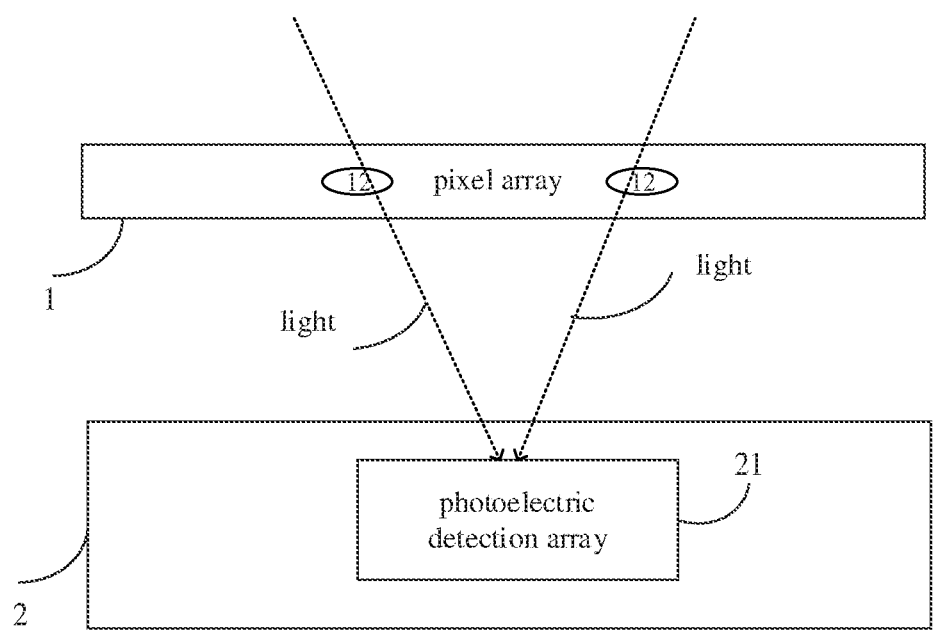
FIG. 2D is a schematic diagram illustrating that light passes through a through hole according to an exemplary embodiment of the present disclosure.

Referring to FIG. 2D, the photoelectric detection array 21 is configured to detect incident light passing through the through holes 12.

In exemplary embodiments, the pixel array 1 is configured to display an image. The pixel array 1 includes a plurality of pixels. Each pixel is consisted of subpixels responding to light with different colors. For example, each pixel may be consisted of a red (R) subpixel responding to red light, a green (G) subpixel responding to green light, and a blue subpixel responding to blue light.

In addition, a gap exists between every two subpixels included in the plurality of subpixels 11 of the pixel array 1. A through hole 12 is arranged within the gap. Light external to the display panel 20 may be transmitted through the through hole 12. In a practical application, the through hole 12 may be an optical micro through hole. The optical micro through hole refers to a small through hole through which light may be transmitted and which may be invisible to human eyes. In addition, transmittance material may be arranged within the through hole 12. That is, the through hole 12 is filled with the transmittance material, which may avoid the through hole 12 being obstructed by other material during the manufacture of the display panel 20. The transmittance material refers to a material that is light-transmitting. For example, the transmittance material is fiber, or the like.

In exemplary embodiments, the photoelectric detection unit 2 is configured to detect light arriving at the photoelectric detection array 21. The light external to the display panel 20 may be incident to the display panel 20 through the through holes 12 and may be detected by the photoelectric detection array 21.

In addition, when the display panel 20 is placed in a normal mode, the pixel array 1 may be located at an upper position of the display panel 20, and the photoelectrical detection array 21 may be located at a lower position of the display panel 20, as long as the light external to the display panel 20 may pass through the through holes 12.

In exemplary embodiments, the display panel 20 may be an organic light-emitting diode (OLED) panel. Since the pixel array of the OLED panel may be self-light-emitting, the light emitted by the OLED panel may directly exit from the OLED panel and may not travel inwards to reach the photoelectric detection array 21. Therefore, the photoelectric detection unit 2 may not be affected when detecting external ambient light.

In exemplary embodiments, when a terminal having the display panel 20 performs the photoelectric detection, there is no need to arrange a through hole in a partial region outside a display region of the display panel 20. The photoelectric detection array 21 included in the display panel 20 may be configured to perform the photoelectric detection. Therefore, an additional region being occupied by the through hole on the display panel and the display region being restricted on the display panel may be avoided, thereby increasing a screen ratio of the terminal, improving display performance of the terminal, and improving the appearance of the terminal.

In exemplary embodiments, the photoelectric detection unit 2 is configured to form a part of detection circuitry of a photodetector. The photodetector is configured to detect light. The photoelectric detection unit 2 may be configured to detect the external ambient light using the photoelectric detection array 21.

Figure 2E:
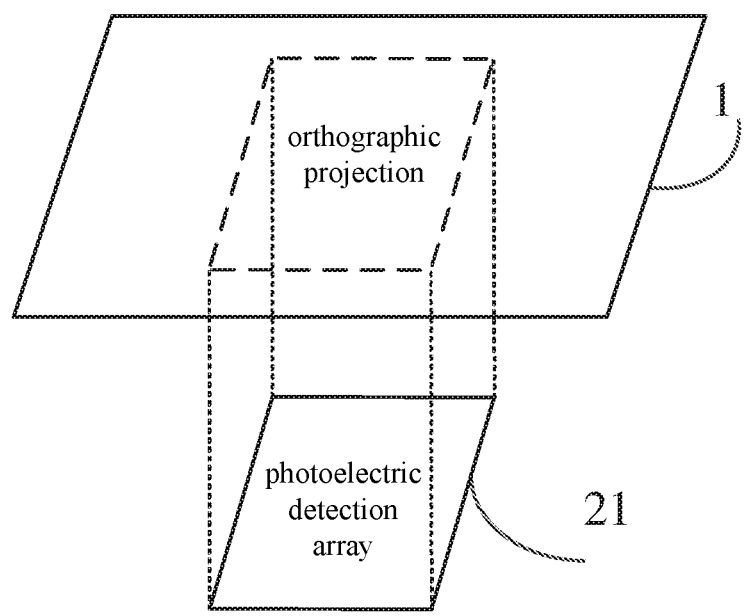
FIG. 2E is a schematic diagram illustrating a display panel according to an exemplary embodiment of the present disclosure.

Referring to FIG. 2E, a part of an orthographic projection of the photoelectric detection array 21 on a plane where the pixel array 1 is located is within the pixel array 1.

In exemplary embodiments, the orthographic projection of the photoelectric detection array 21 on the plane where the pixel array 1 is located may be entirely or partially within the pixel array 1. Accordingly, the photoelectric detection array 21 and the pixel array 1 may be located in a same region of the display panel 20. Since the pixel array 1 is arranged at the display region of the display panel 20 for displaying the image, the photoelectric detection array 21 may be also located in the display region of the display panel 20. Therefore, the photoelectric detection array 21 occupying a partial region other than the display region of the display panel may be avoided, thereby further improving an occupied area of the display region, improving the screen ratio, and improving the display performance.

In exemplary embodiments, the plurality of subpixels 11 may be within an orthographic projection of the photoelectric detection array 21 on the plane of the pixel array.

In exemplary embodiments, the through hole 12 is arranged such that light may pass through the display panel and be detected by the photoelectric detection array 21. Therefore, the through hole 12 is arranged in a gap among subpixels 11 that are within the orthographic projection of the photoelectric detection array 21 on the plane where the pixel array 1 is located. That is, the plurality of subpixels 11 are within the orthographic projection of the photoelectric detection array 21 on the plane of the pixel array 1.

In the illustrated embodiments of the present disclosure, the display panel includes the pixel array and the photoelectric detection unit. The through holes are arranged in gaps among the plurality of subpixels included in the pixel array. The photoelectric detection array included in the photoelectric detection unit is configured to detect incident light passing through the through holes. When the terminal having the display panel performs the photoelectric detection, there is no requirement to arrange a through hole in the partial region of the display panel other than the display region. The photoelectric detection array included in the display panel may be configured to perform the photoelectric detection. Therefore, the through hole additionally occupying the display panel and the area of the display region being restricted on the display panel may be avoided, thereby improving the screen ration of the terminal, improving the display performance of the terminal, and improving the appearance of the terminal.

FIG. 3 is a flow chart illustrating a photoelectric detection method 300 according to an exemplary embodiment. As illustrated in FIG. 3, the method 300 is applied to a terminal having a display panel illustrated as any one of FIGS. 2A to 2E. The method 300 includes the following.

In block S301, a plurality of target subpixels are determined from a plurality of subpixels of a pixel array. The plurality of target pixels are within an orthographic projection of the photoelectric detection array on the plane of the pixel array.

In block 302, a time period when the plurality of target subpixels do not emit light is determined.

In block 303, during the time period, incident light passing through the through holes is detected by a photoelectric detection array.

In the illustrated embodiments of the present disclosure, the subpixels within the orthographic projection of the photoelectric detection array on the plane of the pixel array are determined as the plurality of target subpixels. The time period when the plurality of target subpixels do not emit light is determined. The incident light passing through the through holes are detected by the photoelectric detection array during the time period. Since the plurality of target subpixels do not emit light during the time period, external ambient light passing through the through holes may be detected by the photoelectric detection array during that time period. Therefore, even if the photoelectric detection array is arranged within the display region of the display panel, an accurate detection of the external ambient light may be achieved. In addition, since there is no need to arrange holes in a partial region other than the display region on the display panel to perform the photoelectric detection, occupation of an additional region of the display panel by holes may be avoided and the area of the display panel being restricted on the display panel may be avoided, thereby increasing a screen ratio of the terminal, improving display performance of the terminal, and improving the appearance of the terminal.

In some embodiments, when the terminal is in a screen-on status, the plurality of subpixels may not emit light during at least one first time period of a plurality of successive time periods. The plurality of subpixels may emit light within remaining time periods of the plurality of successive time periods, other than the at least one first time period. Accordingly, determining the time period when the plurality of target subpixels do not emit light includes the following. When the terminal is in the screen-on status, the at least one first time period is determined as the time period when the plurality of target subpixels do not emit light.

In some embodiments, when the terminal is in the screen-on status, the plurality of subpixels emit light in turn within any one of the plurality of successive time periods. Accordingly, determining the time period when the plurality of target subpixels do not emit light includes the following. When the terminal is in the screen-on status, a time period when a control of the plurality of target subpixels to emit light is not started within any one of the plurality of successive time periods is determined as the time period when the plurality of target subpixels do not emit light.

In some embodiments, when the terminal is in the screen-on status, the plurality of subpixels emit light during at least one second time period of the plurality of successive time periods. Accordingly, determining the time period when the plurality of target subpixels do not emit light includes the following. When the terminal is in the screen-on status, a time period between two adjacent second time periods of the plurality of successive time periods is determined as the time period when the plurality of target subpixels do not emit light.

The above technical solutions in different embodiments may be combined to provide additional embodiments of the present disclosure.

Figure 4A:
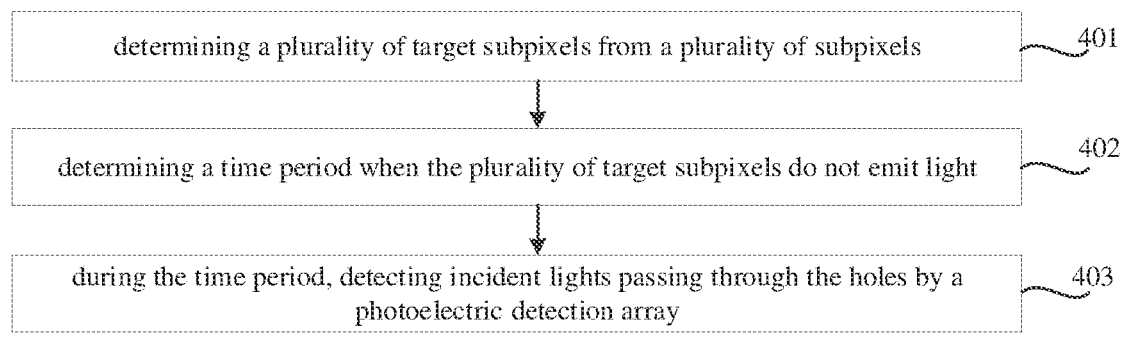
FIG. 4A is a flow chart illustrating a photoelectric detection method according to an exemplary embodiment of the present disclosure.

FIG. 4A is a flow chart illustrating a photoelectric detection method 400 according to an exemplary embodiment. As illustrated in FIG. 4A, the method 400 is applied to a terminal having the display panel illustrated as any one of FIGS. 2A to 2E. The method 400 includes the following.

In block 401, a plurality of target subpixels are determined from a plurality of subpixels of a pixel array.

In exemplary embodiments, the plurality of target subpixels are within the orthographic projection of the photoelectric detection array on the plane where the pixel array is located.

Since the through holes are arranged within gaps among the plurality of subpixels included in the subpixel array, not only external ambient light may pass through the through holes to arrive at the pixel array, but also light emitted from the plurality of subpixels may pass through the through holes to arrive at the pixel array. Therefore, in order to facilitate subsequent removal of influence of the light emitted by the plurality of subpixels in detecting the external ambient light, the subpixels that may emit light passing through the through holes may be determined from the plurality of subpixels. That is, the subpixels whose positions are within the orthographic projection of the photoelectric detection array on the plane of the pixel array are determined.

Figure 4B:
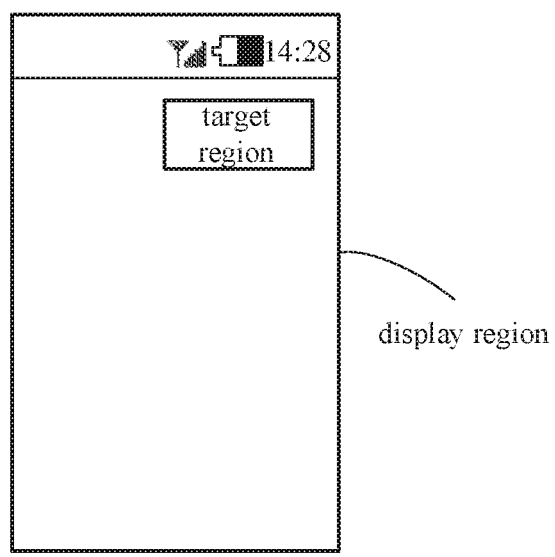
FIG. 4B is a schematic diagram illustrating a terminal according to an exemplary embodiment of the present disclosure.

For example, as illustrated in FIG. 4B, assuming that the orthographic projection of the photoelectric detection array on the plane of the pixel array is a target region included in the display region of the display panel, (that is, the photoelectric detection array is arranged below the target region), the subpixels of the pixel array whose orthographic projection is within the target region may be determined as the target subpixels.

In block 402, the time period when the plurality of target subpixels do not emit light is determined.

In exemplary embodiments, in order to prevent light emitted by the plurality of target subpixels and passing through the through holes in the terminal from being detected by the photoelectric detection array so as to affect an accuracy of detection of the external ambient light by the photoelectric detection array, the time period when the plurality of target subpixels do not emit light may be determined, such that the time period may be used for the detection of the external ambient light subsequently.

Implementation of the block 402 may be at least one of the following three implementations.

In a first implementation, when the terminal is in the screen-on status, the plurality of subpixels do not emit light during at least one first time period of a plurality of successive time periods; while the plurality of subpixels emit light during remaining time periods of the plurality of successive time periods, other than the at least one first time period. That is to say, when the terminal is in the screen-on status, the terminal may control the plurality of subpixels to emit light during the at least one first time period of the plurality of successive time periods and control the plurality of subpixels to not emit light during the remaining time periods of the plurality of successive time period other than the at least one first time period. When the terminal is in the screen-on status, the at least one first time period of the plurality of successive time periods is determined as the time period when the plurality of target subpixels do not emit light.

For example, when the terminal is in the screen-on status, the plurality of subpixels do not emit light continuously. Instead, the plurality of subpixels emit light periodically. For example, a time duration for emitting light is 16.6 milliseconds (ms). When the terminal is in the screen-on status, the plurality of subpixels may emit light for 16.6 ms and then stop emitting light. Afterwards, the plurality of subpixels may emit light again for 16.6 ms and then stop emitting light again. The above process is repeated until the terminal enters into a screen-off status. The screen-off status refers to a status where the screen does not emit light.

In addition, the plurality of successive time periods may be set in advance. The terminal may control the plurality of subpixels during the plurality of successive time periods. That is, an image displayed on the display region of the display panel of the terminal is constantly updated during the plurality of successive time periods. In order to avoid causing an effect on viewing the image, a frequency of updating may be greater than a certain value. That is, the time duration of each of the plurality of successive time periods may be less than a certain value. For example, when the frequency of updating is greater than 30 frames per second, no effect on the viewing may be caused. Therefore, the terminal may update the image at the frequency of updating 60 frames per second. That is, in every second, there are 60 successive time periods, and the time duration of each time period is 16.6 ms.

In embodiments of the present disclosure, when the terminal is in the screen-on status, the plurality of subpixels may be controlled to periodically emit light during the remaining time periods of the plurality of successive time periods other than the at least one first time period, while the plurality of subpixels may be controlled to not emit light during the at least one first time period of the plurality of successive time periods (that is the plurality of target subpixels are controlled to not emit light). Therefore, the at least one first time period of the plurality of successive time periods may be determined as the time period when the plurality of target subpixels do not emit light.

For example, there are 60 successive time periods. Assuming that the plurality of subpixels do not emit light during 20 time periods; while the plurality of subpixels emit light during the remaining 40 time periods excluding the 20 time periods, the 20 time periods may be determined as the time period when the plurality of target subpixels do not emit light.

In a second implementation, when the terminal is in the screen-on status, the plurality of subpixels emit light in turn during any one of the plurality of successive time periods. That is, when the terminal is in the screen-on status, the terminal may control the plurality of subpixels to emit light in turn during any one of the plurality of successive time periods. When the terminal is in the screen-on status, a time period when a control of the plurality of target subpixels to emit light is not started within any one of the plurality of successive time periods is determined as the time period when the plurality of target subpixels do not emit light.

For example, when the terminal is in the screen-on status, during any one of the plurality of successive time periods, the plurality of subpixels may be controlled to emit light in turn according to an order: e.g., starting from a first subpixel at a bottom-left corner, the subpixels from left to right and then from bottom to top emit light in turn. In the above controlling process, when the control of the plurality of target subpixels to emit light is not started, the plurality of target subpixels may not emit light. In other words, a certain time period exits between a time instant when the first subpixel starts to emit light and a time instant when any one of the plurality of target subpixels emit light, and during the certain time period, the plurality of target subpixels do not emit light. Therefore, the time period when the control of the plurality of target subpixel to emit light is not stated within any one of the plurality of successive time periods is determined as the time period when the plurality of target subpixels do not emit light.

Additionally, the time duration of the time period when the plurality of target subpixels do not emit light may be $((L2-L1)/L2)*T$. The bottom-left corner of the plurality of subpixels is determined as a coordinate origin, a left-right direction of the plurality of subpixels is determined as abscissa axis, and an up-down direction of the plurality of subpixels is determined as ordinate axis, to define a coordinate system. $L1$ denotes an ordinate of a target subpixel controlled to emit light firstly of the plurality of the target subpixels, $L2$ denotes an ordinate of the target subpixel controlled to emit light lastly of the plurality of the target subpixels, and $T$ denotes a time duration of any time period.

Further, when the time period when the control of the plurality of target subpixels to emit light is not started within any one of the plurality of successive time periods is determined as the time duration when the plurality of target subpixels do not emit light, a part or all of the time duration when the control of the plurality of target subpixels to emit light is not started within any time period may be determined as the time period when the plurality of target subpixels do not emit light.

For example, the plurality of target subpixels may be arranged near an upper-left corner of the pixel array, such that the plurality of target subpixels emit light relatively late, and the time duration when the plurality of target subpixels do not emit light is relatively long. Therefore, the photoelectric detection may be performed during the long time duration, thereby improving accuracy of the photoelectric detection.

The implementation of determining the time duration that the control of the plurality of target subpixels to emit light is not started within in any one of the plurality of successive time periods as the time duration when the plurality of target subpixels do not emit light may be realized as follows. The display region is divided into a plurality of regions. At least one region where the plurality of target subpixels are located is determined as a first region. A region where the subpixels are controlled to emit light before the target subpixels are controlled to emit light among the plurality of regions are determined as a second region. A time period from controlling a first subpixel included in the second region to emit light to controlling a last subpixel included in the second region to emit light is determined as the time period when the plurality of target subpixels do not emit light.

Figure 4C:
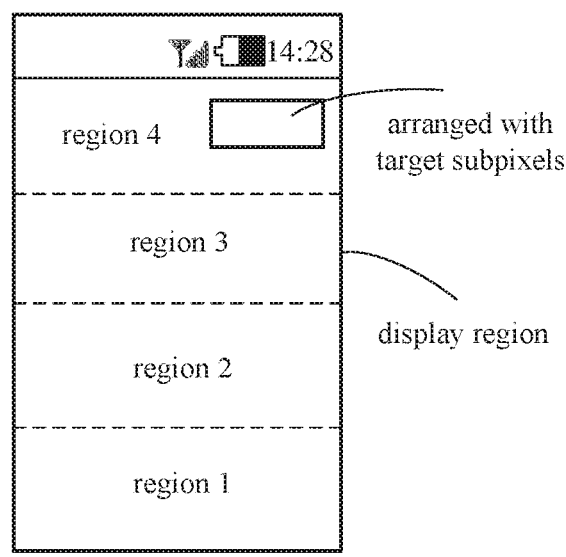
FIG. 4C is a schematic diagram illustrating a terminal according to an exemplary embodiment of the present disclosure.

For example, as illustrated in FIG. 4C, the display region is divided into 4 regions, including region 1, region 2, region 3 and region 4. The plurality of target subpixels are located in the region 4. When the terminal is in the screen-on status, the time period from controlling the first subpixel included in the region 1 to emit light to controlling the last subpixel included in region 3 to emit light is determined as the time period when the plurality of target subpixels do not emit light.

In a third implementation, when the terminal is in the screen-on status, the plurality of subpixels emit light within at least one second time period of the plurality of successive time periods. In other words, when the terminal is in the screen-on status, the terminal may control the plurality of subpixels to emit light within the at least one second time period of the plurality of successive time periods. When the terminal is in the screen-on status, the time period between two adjacent second time periods of the plurality of successive time periods is determined as the time period when the plurality of target subpixels do not emit light.

For example, when the terminal is in the screen-on status, the terminal may control the plurality of subpixels to emit light during the at least one second time period of the plurality of successive time periods. In other words, the plurality of subpixels emit light when any one second time period of the at least one second time period is entered, and stop emitting light when that second time period is over. The plurality of target subpixels emit light again during a next second time period adjacent to the above-mentioned second time period and do not emit light during the time period between the two adjacent second time periods. Therefore, the time period between the two adjacent second time periods of the plurality of successive time periods is determined as the time period when the plurality of target subpixels do not emit light.

In block 403, during the time period, the incident light passing through the through holes is detected by the photoelectric detection array.

For example, during the time period, the plurality of target subpixels do not emit light. As a result, the incident light passing through the through holes and detected by the photoelectric detection array is the external ambient light. In other words, within the time period, detecting the incident light passing through the through holes by the photoelectric detection array is detecting the external ambient light.

Implementations of the block 403 may be realized as follows. A first interrupt signal is sent to the photoelectric detection array at a start of the time period to instruct the photoelectric detection array to perform the photoelectric detection. A second interrupt signal is sent to the photoelectric detection array at an end of the time period to instruct the photoelectric detection array to stop the photoelectric detection.

For example, the first interrupt signal and the second interrupt signal each may be a hardware interrupt signal. The first interrupt signal is configured to control the photoelectric detection array to perform the photoelectric detection, and the second interrupt signal is configured to control the photoelectric detection array to stop the photoelectric detection.

In the illustrated embodiments of the present disclosure, after the subpixels within the orthographic projection of the photoelectric detection array on the plane of the pixel array are determined as the plurality of target subpixels, the time period when the plurality of target subpixels do not emit light is determined. During the time period, the incident light passing through the through holes is detected by the photoelectric detection array. Since the plurality of target subpixels do not emit light during the time period, the external ambient light passing through the through holes may be detected by the photoelectric detection array during the time period. Therefore, even if the photoelectric detection array is arranged in the display region of the display panel, the external ambient light may be accurately detected. In addition, there is no need to arrange a hole in a partial region other than the display region of the display panel to perform the photoelectric detection, which may avoid the hole occupying an additional region of the display panel and the area of the display region on the display panel being restricted, thereby increasing the screen ratio of the terminal, improving the display performance of the terminal, and improving the appearance of the terminal.

Figure 5A:
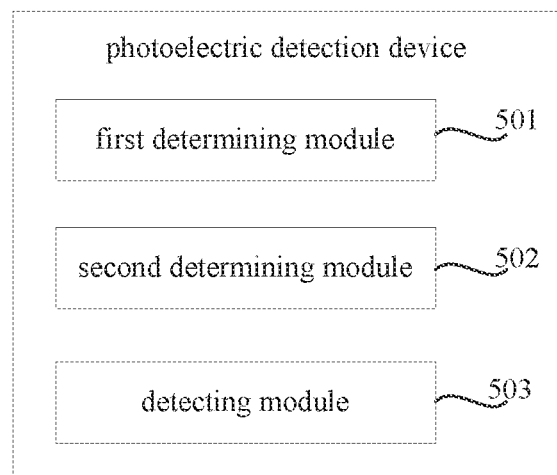
FIG. 5A is a block diagram illustrating a photoelectric detection device according to an exemplary embodiment of the present disclosure.

FIG. 5A is a block diagram illustrating a photoelectric detection device 500 according to an exemplary embodiment. Referring to FIG. 5A, the photoelectric detection device 500 may be incorporated in a terminal having the display panel illustrated as any one of FIGS. 2A to 2E. The device 500 includes a first determining module 501, a second determining module 502, and a detecting module 503.

The first determining module 501 is configured to determine a plurality of target subpixels from a plurality of subpixels of a pixel array. The plurality of target subpixels are within an orthographic projection of the photoelectric detection array on the plane of the pixel array.

The second determining module 502 is configured to determine a time period when the plurality of target subpixels do not emit light.

Figure 5B:
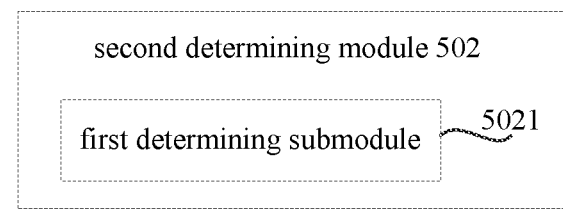
FIG. 5B is a block diagram illustrating a second determining module according to an exemplary embodiment of the present disclosure.

The detecting module 503 is configured to detect incident light passing through the through holes by the photoelectric detection array during the time period. In some embodiments, when the terminal is in the screen-on status, the plurality of pixels do not emit light during at least one first time period of the plurality of successive time periods, and emit light during remaining time periods of the plurality of successive time periods, other than the at least one first time period. Accordingly, referring to FIG. 5B, the second determining module 502 includes a first determining submodule 5021. The first determining submodule 5021 is configured to determine the at least one first time period of the plurality of successive time periods as the time period when the plurality of target subpixels do not emit light when the terminal is in the screen-on status.

Figure 5C:
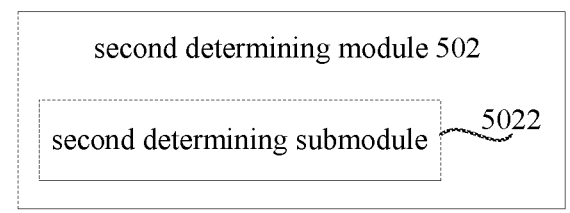
FIG. 5C is a block diagram illustrating a second determining module according to an exemplary embodiment of the present disclosure.

In some embodiments, when the terminal is in the screen-on status, the plurality of subpixels emit light in turn during any one of the plurality of successive time periods. Accordingly, referring to FIG. 5C, the second determining module 502 includes a second determining submodule 5022. The second determining submodule 5022 is configured to determine a time period when a control of the plurality of target subpixels to emit light is not started within any one of the plurality of successive time periods as the time period when the plurality of target subpixels do not emit light.

Figure 5D:
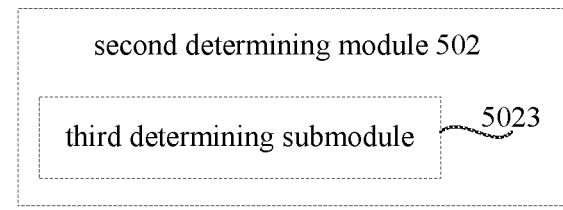
FIG. 5D is a block diagram illustrating a second determining module according to an exemplary embodiment of the present disclosure.

In some embodiments, when the terminal is in the screen-on status, the plurality of subpixels emit light during at least one second time period of the plurality of successive time periods, when the terminal is in the screen-on status. Accordingly, referring to FIG. 5D, the second determining module 502 includes a third determining submodule 5023. The third determining submodule 5023 is configured to determine a time period between two adjacent second time periods of the plurality of successive time periods as the time period when the plurality of target subpixels do not emit light.

In the illustrated embodiments of the present disclosure, after the subpixels whose positions are within the orthographic projection of the photoelectric detection array on the plane of the pixel array are determined as the plurality of target subpixels, the time period when the plurality of target subpixels do not emit light is determined. During the time period, the incident light passing through the through holes is detected by the photoelectric detection array. Since the plurality of target subpixels do not emit light during the time period, the external ambient light passing through the through holes may be detected by the photoelectric detection array during the time period. Therefore, even if the photoelectric detection array is arranged in the display region of the display panel, the external ambient light may be accurately detected. In addition, there is no need to arrange a hole in a partial region other than the display region of the display panel to perform the photoelectric detection, which may avoid the hole occupying an additional region of the display panel and the area of the display region on the display panel being restricted, thereby increasing the screen ratio of the terminal, improving the display performance of the terminal, and improving the appearance of the terminal.

Figure 6:
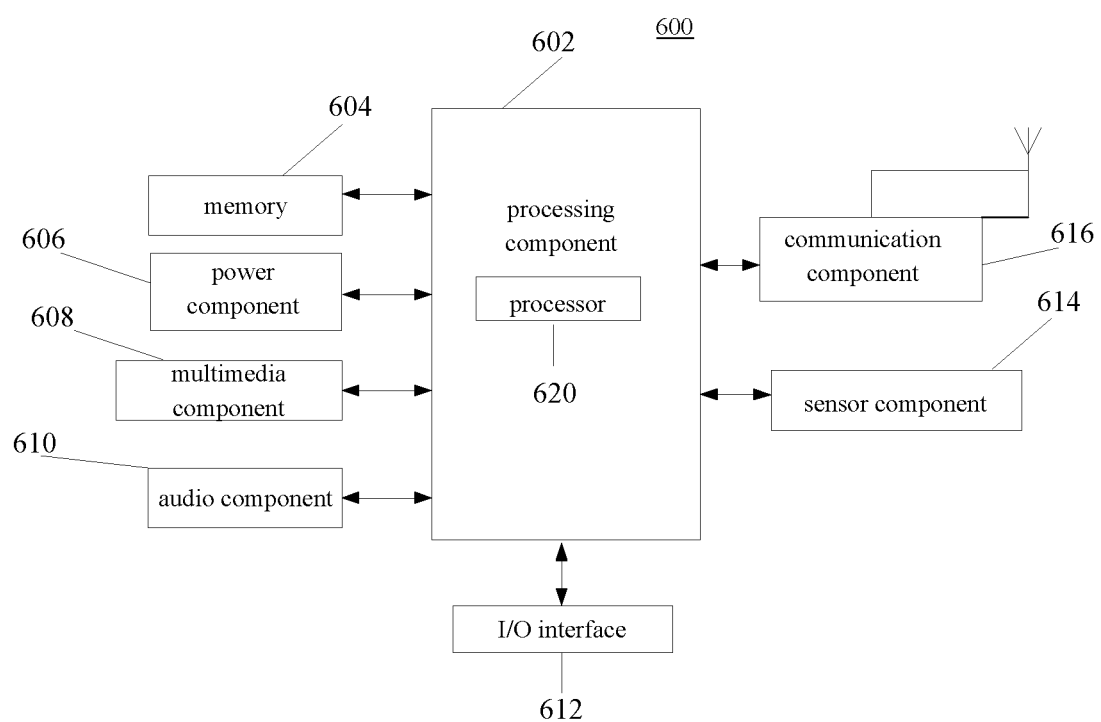
FIG. 6 is a block diagram illustrating a photoelectric detection device according to an exemplary embodiment of the present disclosure.

FIG. 6 is a block diagram illustrating a photoelectric detection device 600 according to an exemplary embodiment. For example, the device 600 may be mobile phone, a computer, a digital broadcasting terminal, a messaging device, a game console, a tablet device, a medical device, fitness equipment, a Personal Digital Assistant PDA, and the like.

Referring to FIG. 6, the device 600 may include the following one or more components: a processing component 602, a memory 604, a power component 606, a multimedia component 608, an audio component 610, an Input/Output (I/O) interface 612, a sensor component 614, and a communication component 616.

The processing component 602 typically controls overall operations of the device 600, such as the operations associated with display, telephone calls, data communications, camera operations, and recording operations. The processing component 602 may include one or more processors 620 to execute instructions to perform all or part of the steps in the above described methods. Moreover, the processing component 602 may include one or more modules which facilitate the interaction between the processing component 602 and other components. For instance, the processing component 602 may include a multimedia module to facilitate the interaction between the multimedia component 608 and the processing component 602.

The memory 604 is configured to store various types of data to support the operation of the device 600. Examples of such data include instructions for any applications or methods operated on the device 600, contact data, phonebook data, messages, pictures, video, etc. The memory 604 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 606 provides power to various components of the device 600. The power component 606 may include a power management system, one or more power sources, and any other components associated with the generation, management, and distribution of power in the device 600.

The multimedia component 608 includes a screen providing an output interface between the device 600 and the user. In some embodiments, the screen may include a liquid crystal display (LCD) and a press panel (TP). If the screen includes the touch panel, the screen may be implemented as a touch screen to receive input signals from the user. The touch panel includes one or more touch sensors to sense touches, swipes, and other gestures on the touch panel. The touch sensors may not only sense a boundary of a touch or swipe action, but also sense a duration time and a pressure associated with the touch or swipe action. In some embodiments, the multimedia component 608 includes a front camera and/or a rear camera. The front camera and/or the rear camera may receive external multimedia data while the device 600 is in an operation mode, such as a photographing mode or a video mode. Each of the front camera and the rear camera may be a fixed optical lens system or have focus and optical zoom capability.

The audio component 610 is configured to output and/or input audio signals. For example, the audio component 610 includes a microphone (MIC) configured to receive an external audio signal when the device 600 is in an operation mode, such as a call mode, a recording mode, and a voice recognition mode. The received audio signal may be further stored in the memory 604 or transmitted via the communication component 616. In some embodiments, the audio component 610 further includes a speaker to output audio signals.

The I/O interface 612 provides an interface for the processing component 602 and peripheral interface modules, such as a keyboard, a click wheel, buttons, and the like. The buttons may include, but are not limited to, a home button, a volume button, a starting button, and a locking button.

The sensor component 614 includes one or more sensors to provide status assessments of various aspects of the device 600. For instance, the sensor component 614 may detect an open/closed status of the device 600 and relative positioning of components (e.g. the display and the keypad of the device 600). The sensor component 614 may also detect a change in position of the device 600 or of a component in the device 600, a presence or absence of user contact with the device 600, an orientation or an acceleration/deceleration of the device 600, and a change in temperature of the device 600. The sensor component 614 may include a proximity sensor configured to detect the presence of nearby objects without any physical contact. The sensor component 614 may also include a light sensor, such as a CMOS or CCD image sensor, for use in imaging applications. In some embodiments, the sensor component 614 may also include an accelerometer sensor, a gyroscope sensor, a magnetic sensor, a pressure sensor, or a temperature sensor.

The communication component 616 is configured to facilitate wired or wireless communication between the device 600 and other devices. The device 600 can access a wireless network based on a communication standard, such as WIFI, 2G, or 3G, or a combination thereof. In one exemplary embodiment, the communication component 616 receives a broadcast signal or broadcast associated information from an external broadcast management system via a broadcast channel. In one exemplary embodiment, the communication component 616 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In exemplary embodiments, the device 600 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In exemplary embodiments, there is further provided a non-transitory computer readable storage medium including instructions, such as instructions stored in the memory 604. The instructions may be executed by the processor 602 of the device 600 to perform the above described methods. The non-transitory computer readable storage medium may be ROM, a random accessible memory (RAM), CD-ROM, a tape, a floppy disk, an optical data storage device or the like.

Other embodiments of the disclosure will be apparent to those skilled in the art from consideration of the specification and practice of the disclosure here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the appended claims.

It is to be understood that, the present disclosure is not limited to the exact construction that has been described above and illustrated in the accompanying drawings, and that various modifications and changes can be made without departing form the scope thereof. It is intended that the scope of the disclosure only be limited by the appended claims.

What is claimed is:

1. A photoelectric detection method applied to a terminal having a display panel including a pixel array and a photoelectric detection unit, the pixel array including a plurality of subpixels, wherein through holes are arranged within gaps among the plurality of subpixels, the photoelectric detection unit including a photoelectric detection array configured to detect incident light passing through the through holes, the method comprising:

determining a plurality of target subpixels from the plurality of subpixels, wherein the plurality of target subpixels are within an orthographic projection of the photoelectric detection array on a plane of the pixel array;

determining a time period when the plurality of target subpixels do not emit light; and during the time period, detecting incident light passing through the through holes by the photoelectric detection array, wherein when the terminal is in a screen-on status, the plurality of subpixels emit light in turn during any one of a plurality of successive time periods; and the determining of the time period when the plurality of target subpixels do not emit light comprises:

when the terminal is in the screen-on status, determining a time period when a control of the plurality of target subpixels to emit light is not started within any one of the plurality of successive time periods as the time period when the plurality of target subpixels do not emit light, wherein the display panel includes a display region, and the method further comprises:

dividing the display region into a plurality of regions;

determining a region where the plurality of subpixels are located from the plurality of regions; and within remaining regions other than the region where the plurality of subpixels are located, determining a time period from controlling a first subpixel to emit light to controlling a last subpixel to emit light as the time period when the plurality of target subpixels do not emit light.

2. The method according to claim 1, wherein when the terminal is in a screen-on status, the plurality of subpixels do not emit light during at least one first time period among a plurality of successive time periods, and the plurality of subpixels emit light during remaining time periods of the plurality of successive time periods other than the at least one first time period; and the determining of the time period when the plurality of target subpixels do not emit light comprises:

when the terminal is in the screen-on status, determining the at least one first time period among the plurality of successive time periods as the time period when the plurality of target subpixels do not emit light.

3. The method according to claim 1, further comprising: determining a part or all of the time period when the control of the plurality of target subpixels to emit light is not started within any one of the plurality of successive time periods as the time period when the plurality of target subpixels do not emit light.

4. The method according to claim 1, wherein when the terminal is in a screen-on status, the plurality of subpixels emit light during at least one second time period among a plurality of successive time periods; and the determining of the time period when the plurality of target subpixels do not emit light comprises:

when the terminal is in the screen-on status, determining a time period between two adjacent second time periods of the plurality of successive time periods as the time period when the plurality of target subpixels do not emit light.

5. The method according to claim 1, wherein the detecting of incident light passing through the through holes by the photoelectric detection array during the time period comprises:

sending a first interrupt signal to the photoelectric detection array at a start of the time period to instruct the photoelectric detection array to perform photoelectric detection; and sending a second interrupt signal to the photoelectric detection array at an end of the time period to instruct the photoelectric detection array to stop the photoelectric detection.

6. The method according to claim 1, wherein:

a part of the orthographic projection of the photoelectric detection array on the plane of the pixel array is within the pixel array.

7. The method according to claim 1, wherein transmittance material is arranged in the through holes.

8. The method according to claim 1, wherein the plurality of subpixels are within the orthographic projection of the photoelectric detection array on the plane of the pixel array.

9. The method according to claim 1, wherein the photoelectric detection unit is configured as a part of detection circuitry of a photodetector.

10. The method according to claim 1, wherein the display panel is an organic light-emitting diode (OLED) panel.

11. A terminal, comprising:

a display panel including a pixel array and a photoelectric detection unit, the pixel array including a plurality of subpixels, wherein through holes are arranged within gaps among the plurality of subpixels, and the photoelectric detection unit including a photoelectric detection array configured to detect incident light passing through the through holes, a processor coupled to the display panel; and a memory configured to store instructions executable by the processor;

wherein the processor is configured to:

determine a plurality of target subpixels from the plurality of subpixels, wherein the plurality of target subpixels are within an orthographic projection of the photoelectric detection array on a plane of the pixel array;

determine a time period when the plurality of target subpixels do not emit light; and during the time period, detect incident light passing through the through holes by the photoelectric detection array, wherein when the terminal is in a screen-on status, the plurality of subpixels emit light in turn during any one of a plurality of successive time periods; and the processor is configured to, when the terminal is in the screen-on status, determine a time period when a control of the plurality of target subpixels to emit light is not started within any one of the plurality of successive time periods as the time period when the plurality of target subpixels do not emit light, wherein the display panel comprises a display region; and the processor is further configured to:

divide the display region into a plurality of regions;

determine a region where the plurality of subpixels are located from the plurality of regions; and within remaining regions other than the region where the plurality of subpixels are located, determine a time period from controlling a first subpixel to emit light to controlling a last subpixel to emit light as the time period when the plurality of target subpixels do not emit light.

12. The terminal according to claim 11, wherein when the terminal is in a screen-on status, the plurality of subpixels do not emit light during at least one first time period among a plurality of successive time periods, and the plurality of subpixels emit light during remaining time periods of the plurality of successive time periods other than the at least one first time period; and the processor is configured to determine the time period when the plurality of target subpixels do not emit light by acts of:

when the terminal is in the screen-on status, determining the at least one first time period among the plurality of successive time periods as the time period when the plurality of target subpixels do not emit light.

13. The terminal according to claim 11, wherein the processor is configured to determine a part or all of the time period when the control of the plurality of target subpixels to emit light is not started within any one of the plurality of successive time periods as the time period when the plurality of target subpixels do not emit light.

14. The terminal according to claim 11, wherein when the terminal is in a screen-on status, the plurality of subpixels emit light during at least one second time period among a plurality of successive time periods; and the processor is configured to, when the terminal is in the screen-on status, determine a time period between two adjacent second time periods of the plurality of successive time periods as the time period when the plurality of target subpixels do not emit light.

15. The terminal according to claim 11, wherein the processor is configured to detect incident light passing through the through holes by the photoelectric detection array during the time period by:

sending a first interrupt signal to the photoelectric detection array at a start of the time period to instruct the photoelectric detection array to perform photoelectric detection; and sending a second interrupt signal to the photoelectric detection array at an end of the time period to instruct the photoelectric detection array to stop the photoelectric detection.

16. The terminal according to claim 11, wherein,
a part of the orthographic projection of the photoelectric detection array on the plane of the pixel array is within the pixel array.

17. The terminal according to claim 11, wherein transmittance material is arranged in the through holes.

18. The terminal according to claim 11, wherein the plurality of subpixels are within the orthographic projection of the photoelectric detection array on the plane of the pixel array.

19. The terminal according to claim 11, wherein the photoelectric detection unit is configured as a part of detection circuitry of a photodetector.

20. The terminal according to claim 11, wherein the display panel is an organic light-emitting diode (OLED) panel.

* * * * *